United States Patent
Nygren et al.

(10) Patent No.: US 7,355,458 B2
(45) Date of Patent: Apr. 8, 2008

(54) OUTPUT DRIVER CIRCUIT AND A METHOD OF TRANSMITTING AN ELECTRICAL SIGNAL VIA AN OUTPUT DRIVER CIRCUIT

(75) Inventors: Aaron Nygren, Munich (DE); Maksim Kuzmenka, Munich (DE)

(73) Assignee: Infineon Technologies, AG, Neubiberg (DE)

(*) Notice: Subject to any disclaimer, the term of this patent is extended or adjusted under 35 U.S.C. 154(b) by 15 days.

(21) Appl. No.: 11/284,134

(22) Filed: Nov. 22, 2005

(65) Prior Publication Data

US 2006/0132197 A1  Jun. 22, 2006

(30) Foreign Application Priority Data

Nov. 26, 2004  (DE) .................. 10 2004 057 231

(51) Int. Cl.
*H03B 1/00* (2006.01)
(52) U.S. Cl. ...................... 327/108; 327/261
(58) Field of Classification Search ............... None
See application file for complete search history.

(56) References Cited

U.S. PATENT DOCUMENTS

| | | | |
|---|---|---|---|
| 5,497,263 A * | 3/1996 | Masuda et al. ............. 327/278 |
| 5,815,009 A * | 9/1998 | Iadanza et al. ................ 327/5 |
| 6,052,811 A * | 4/2000 | Ahsuri ....................... 714/745 |
| 6,259,294 B1 * | 7/2001 | Murakami et al. .......... 327/277 |
| 6,564,359 B2 * | 5/2003 | Saeki ............................ 716/5 |
| 6,707,727 B2 * | 3/2004 | Tamura et al. .............. 365/192 |
| 6,791,389 B2 * | 9/2004 | Tsuruki et al. .............. 327/276 |
| 6,825,707 B2 * | 11/2004 | Viehmann et al. .......... 327/407 |
| 6,894,933 B2 | 5/2005 | Kuzmenka et al. |

FOREIGN PATENT DOCUMENTS

CN      1538454      10/2004

\* cited by examiner

*Primary Examiner*—Cassandra Cox
(74) *Attorney, Agent, or Firm*—Edell, Shapiro & Finnan, LLC

(57) ABSTRACT

In an output driver circuit, the signal propagation time of an electrical signal which is to be transmitted between two selected driver stages is ascertained. If the ascertained signal propagation time is at least equal to half the period duration of the signal which is to be transmitted, the signal to be transmitted is delayed between the two selected driver stages such that a given signal edge change appears at the output of the other of the selected driver stages at a different time from other signal edge which follow the one given signal edge change in time, at driver stages which are situated upstream of the other of the selected driver stages. The inventive output driver circuit accordingly has a delay element which can be used to influence the signal propagation time between the selected driver stages.

9 Claims, 4 Drawing Sheets

OUTPUT DRIVER CIRCUIT AND A METHOD OF TRANSMITTING AN ELECTRICAL SIGNAL VIA AN OUTPUT DRIVER CIRCUIT

CROSS REFERENCE TO RELATED APPLICATIONS

This application claims priority under 35 USC §119 to German Application No. 10 2004 057 231.3, filed on Nov. 26, 2004, and titled "Method for Transmitting an Electrical Signal, and Output Driver Circuit for an Electrical Signal Which is to be Transmitted," the entire contents of which are hereby incorporated by reference.

FIELD OF THE INVENTION

The present invention relates to an output driver circuit and a method for transmitting an electrical signal via an output driver circuit.

BACKGROUND

Electrical signals to be transmitted, particularly such electrical signals as are intended to be transmitted using an output driver circuit, have either regularly recurring signal edge changes (e.g. when the electrical signals to be transmitted are clock signals) or irregularly recurring signal edge changes (e.g. when the electrical signals to be transmitted are data output signals from a semiconductor memory). In each case, however, these signals have a fixed period duration and these signal edge changes take place at the end of the latter's period. External influences such as interference affecting switching elements which carry the signal to be transmitted can result in the signal edge changes not taking place exactly when the respective period duration is in progress, however, but rather within a certain interval around this time. This phenomenon, which is general knowledge, is called "jitter" in specialist circles.

In particular, in the case of output driver circuits in integrated semiconductor circuits, such as integrated semiconductor memories, in practice the electrical signal leaving the output driver circuit, and hence the electrical signal leaving the integrated semiconductor circuit, causes interference at edge-change times which has a capacitive and inductive effect (e.g. via the housing mass of the integrated semiconductor circuit) on the supply potentials for the integrated semiconductor circuit, and hence in turn on the output driver circuit. In some cases, these effects are also transferred via the substrate of the integrated semiconductor circuit containing the output driver circuit. If such an edge change affected by interference or causing interference now appears exactly at the time at which the signal to be transmitted within the output driver circuit has a further edge change, this further edge change is subjected to jitter, i.e. the further edge change actually appearing does not take place exactly at the prescribed time. This is then reproduced across all driver stages in the signal path which follow the driver stage at which this jitter appeared for the first time.

In the past, this was not a problem, however, since the period durations of signals to be transmitted were sufficiently long for the edge changes not to be in the critical time range. However, today's "fast" signals have such short period durations that the risk of jitter is no longer negligible.

SUMMARY

It is therefore an object of the present invention to develop a method for transmitting an electrical signal so that the risk of jitter appearing is minimized.

It is another object of the present invention to develop an output driver circuit that minimizes the risk of the appearance of jitter.

The aforesaid objects are achieved individually and/or in combination, and it is not intended that the present invention be construed as requiring two or more of the objects to be combined unless expressly required by the claims attached hereto.

In accordance with the present invention, a method for transmitting an electrical signal that includes a plurality of signal edge changes and a given period duration comprises: providing an output driver circuit, the output driver circuit including a plurality of driver stages, wherein the driver stages include a first driver stage and a last driver stage, the driver stages are arranged in series with one another in terms of signal flow, and the electrical signal to be transmitted is supplied to an input of the first driver stage and is transmitted from an output of the last driver stage; selecting two driver stages of the output driver circuit and ascertaining the signal propagation time which the signal to be transmitted requires between the input of the one selected driver stage and the output of the other selected driver stage; and, when the ascertained signal propagation time is at least equal to half the period duration of the signal which is to be transmitted, the electrical signal to be transmitted is delayed between the two selected driver stages such that a given signal edge change appears at the output of the other selected driver stage at a different time from other signal edge changes which follow the one given signal edge change in time, appearing at the output of the one selected driver stage and, if other driver stages in the output driver circuit are arranged between the two driver stages, appearing at the outputs of these other driver stages.

In accordance with another embodiment of the present invention, an output driver circuit for an electrical signal which is to be transmitted comprises a plurality of driver stages that are arranged in series with one another in terms of signal flow, wherein the driver stages include a first driver stage and a last driver stage. A delay element is provided in the output driver circuit, where the delay element can be used to influence a signal propagation time between an input of a first selected driver stage and an output of another selected driver stage.

The above and still further objects, features and advantages of the present invention will become apparent upon consideration of the following detailed description of specific embodiments thereof, particularly when taken in conjunction with the accompanying drawings where like numerals designate like components.

DETAILED DESCRIPTION

Investigations into the aforementioned problems have revealed that the risk of jitter appearing is present whenever the signal delay which a signal undergoes when passing through an output driver circuit or parts thereof (generally referred to as signal propagation time) is at least equal to half the period duration of the signal which is to be transmitted. If the signal propagation time is shorter (which is synonymous with the period duration being correspondingly greater) then jitter does not appear. The invention is now based on the general idea of delaying the signal to be transmitted within the output driver circuit, whenever the signal delay which is to be expected is at least equal to half the period duration of the signal which is to be transmitted, such that signal changes appearing at a driver stage under consideration are guaranteed to appear at times at which no signal edge changes appear at the individual driver stages upstream of the output driver stage under consideration.

Figure 1:
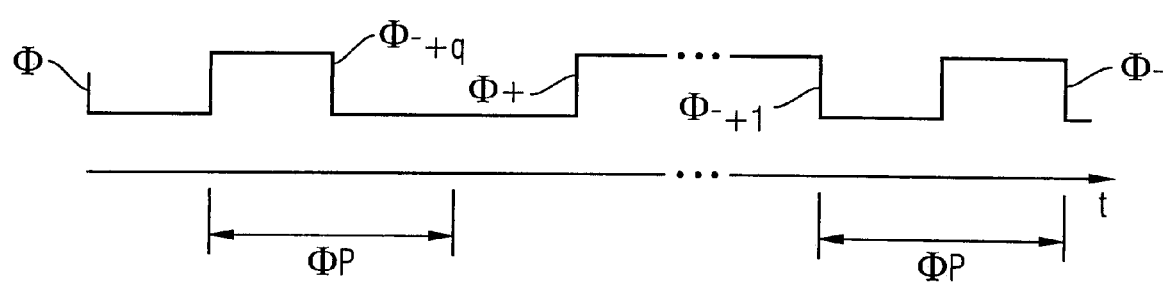
FIG. 1 depicts a plot of a signal which is to be transmitted with various edge changes.

FIG. 1 shows an electrical signal Φ to be transmitted which has positive (Φ+) and negative (Φ−) signal edge changes. An electrical signal Φ of this type may be, by way of example, a data output signal from an integrated semiconductor memory device. It has a period duration ΦP, and it is also possible for fewer than two signal edges changes (Φ+, Φ−) to appear within one period (this is often the case with data output signals, for example). When such an electrical signal is to be transmitted from one integrated circuit, e.g. from the integrated semiconductor memory device, to another electrical circuit, such as a microprocessor contained in another integrated circuit, it is first of all transmitted within the one integrated circuit using an output driver circuit DVR, where it is amplified such that it is then able to perform its intended function in the other integrated circuit.

Figure 3:
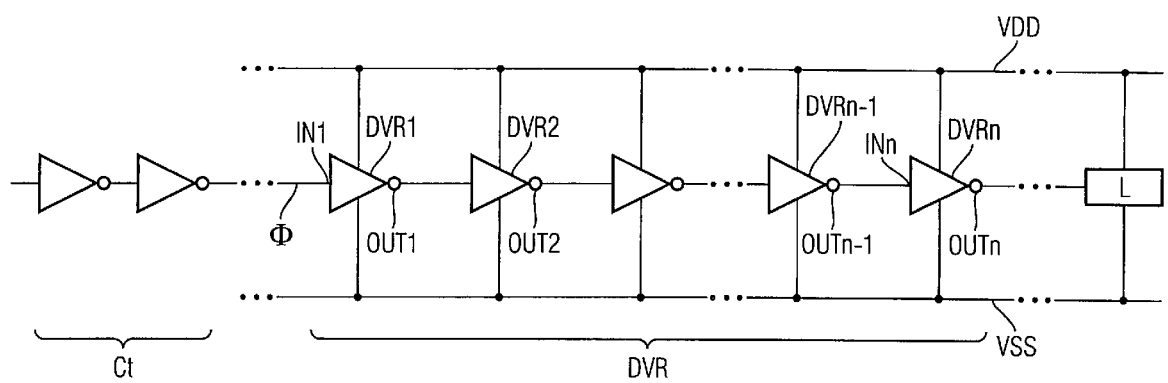
FIG. 3 depicts a schematic of a known output driver circuit.

FIG. 3 shows a conventional output driver circuit DVR to which the electrical signal Φ to be transmitted is supplied from further circuit parts Ct (which are of no further interest in the present case). The output driver circuit DVR has a plurality of (in the example chosen: five) driver stages DVR1, . . . , DVRn with inputs IN1, . . . , INn and with outputs OUT1, . . . , OUTn ("n" is "five" in this case). The electrical signal Φ can then be transmitted from the last driver stage DVRn to another electrical circuit, such as the aforementioned microprocessor. This other electrical circuit is shown symbolically in FIG. 3 as (electrical) load L.

If a signal edge change which is affected by interference or causes interference now appears, as already described at the outset, exactly at the time at which the signal to be transmitted within the output driver circuit has a further signal edge change, this further edge change is subjected to jitter, i.e. the actually appearing further edge change does not take place exactly at the prescribed time at which the signal edge change is actually intended to take place, but rather sometime within an interval around this prescribed time.

In the exemplary embodiments which follow, it is assumed that jitter needs to be avoided across the entire chain of driver stages DVR1 to DVRn. It is naturally also possible to perform the proposed measures only across some of the driver stages in the output driver circuit DVR. In that case, however, jitter is also avoided only in this subrange. The measures to be taken to achieve this can easily be derived by a person skilled in the art from the statements made for the entire chain of driver stages.

In accordance with the invention, two arbitrary driver stages in the output driver circuit DVR are selected in a first step, for example the first driver stage DVR1 and the last driver stage DVRn. A selected signal edge change (Φ+; Φ−) is then used to ascertain the signal propagation time $t_p$ which the electrical signal Φ to be transmitted requires in order to get from the input IN1 of the one (DVR1) of the selected driver stages DVR1, DVRn to the output OUTn of the other (DVRn) of the selected driver stages DVR1, DVRn.

Figure 2:
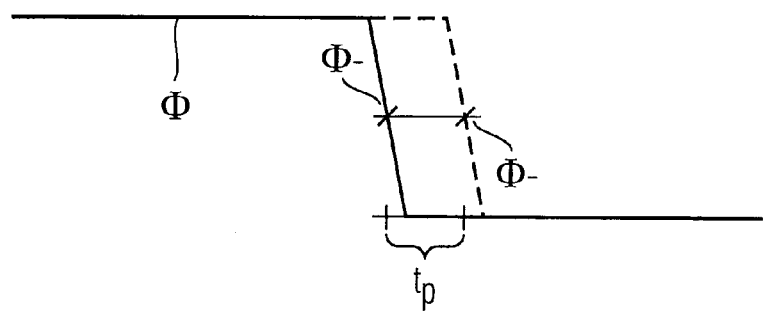
FIG. 2 depicts the signal propagation time of a signal when it is transmitted within an output driver circuit, illustrated with reference to a single signal change.
Figure 4:
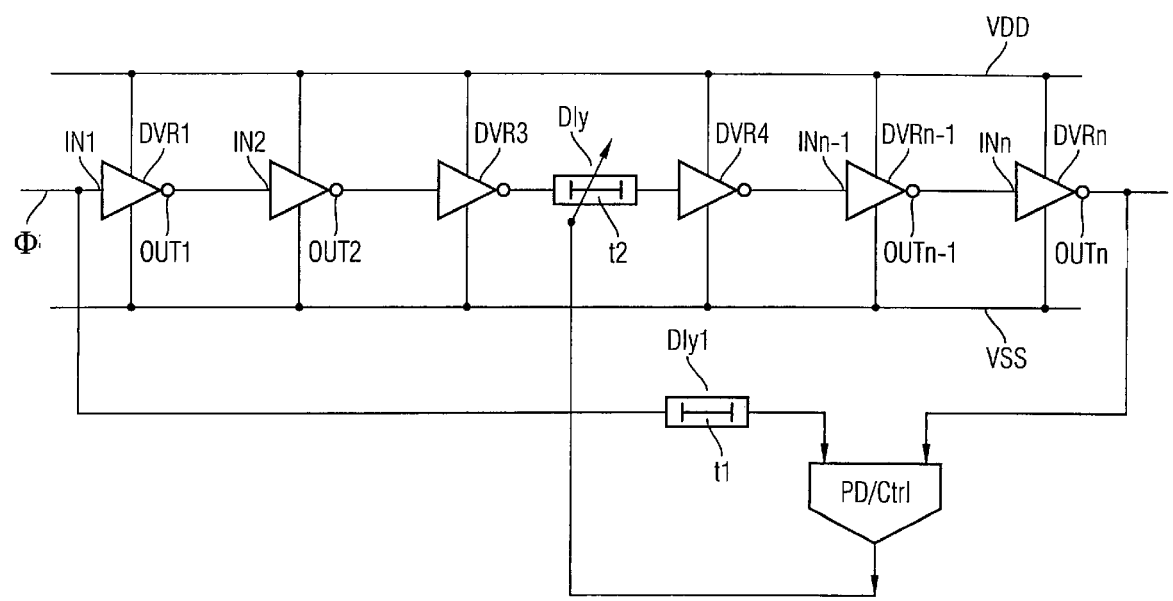
FIGS. 4 and 5 depict output driver circuits in accordance with the present invention.

FIG. 2 shows the signal propagation time $t_p$ between two selected driver stages DVR1, DVRn for a given, selected signal edge change Φ− in the electrical signal Φ. Instead of a falling signal edge change Φ−, as shown, it would also be possible to use a rising signal edge change Φ+ to implement and provide a more detailed explanation of the present invention. In particular, it is also advantageous (and forms the basis of the statements below) to ascertain as signal propagation time $t_p$ that period of time which the selected signal edge change Φ− requires from the input IN1 of the first driver stage DVR1 to the output OUTn of the last driver stage DVRn. This is assumed and illustrated for the advantageous output driver circuit DVR shown in FIG. 4. The output driver circuit DVR shown in FIG. 4 is explained in more detail below.

If this ascertainment, which is a measurement, reveals that the signal propagation time $t_p$ is at least equal to half the period duration ΦP of the electrical signal Φ which is to be transmitted, the invention now involves the electrical signal Φ which is to be transmitted within the output driver circuit DVR being delayed, between the two selected driver stages DVR1, DVRn used to ascertain the signal propagation time $t_p$, such that the given, selected signal edge change Φ− appears at the output OUTn of the other (DVRn) of the two selected driver stages DVR1, DVRn at a different time from other edge changes (e.g., edge changes $\Phi_{-+p}, \ldots, \Phi_{-+q}$ in FIG. 1) appearing at the output OUT1 of the one of the two selected driver stages DVR1, DVRn and, if there are other driver stages DVR2 to DVRn-1 between the two selected driver stages DVR1, DVRn on the basis of the selection made, appearing at the outputs OUT2 to OUTn-1 of the other driver stages DVR2 to DVRn-1, which are arranged between the two selected driver stages DVR1, DVRn.

This method based on the invention can be explained in more detail with reference to a first embodiment of the inventive output driver circuit shown in FIG. 4. FIG. 4 shows, as a first embodiment of the inventive output driver circuit, an output driver circuit with a number of n=6 driver stages DVR1, . . . , DVRn. Each of the driver stages DVR1, . . . , DVRn has an input (IN1 to INn) and an output (OUT1 to OUTn). The electrical signal Φ to be transmitted is transmitted within the output driver circuit from the input IN1 of the first driver stage DVR1 via the other driver stages DVR2, . . . , DVRn-1 to the output OUTn of the last driver stage DVRn, where n=6 in the example chosen here, as already indicated.

This exemplary embodiment is designed to avoid jitter appearing between the first (DVR1) and the last (DVRn) of the driver stages DVR1, . . . , DVRn. For this reason, the first driver stage DVR1 and the last driver stage DVRn are selected. Between the input IN1 of the first driver stage DVR1 and the output OUTn of the last driver stage DVRn as the selected driver stages, the signal propagation time $t_p$ of the electrical signal Φ is then measured or ascertained using a measurement and control circuit PD/Ctrl, for example.

To ensure that no measured-value detection or processing errors arise in this case on account of the fact that signal propagation times $t_p$ are normally very short, as a precaution there is at this point another delay element Dly1 which delays the signal edge change Φ− detected at the input IN1 of the first driver stage DVR1 by a fixed delay time t1. In this case, this is merely a purely measurement-related, generally customary measure, however, which has nothing to do with the present invention as such and which can also be dispensed with, if appropriate, if the measurement and control circuit PD/Ctrl is suitably sensitive.

At an arbitrary point between the two selected driver stages DVR1, DVRn in the chain of driver stages DVR1 to DVRn (in the embodiment shown in FIG. 4: between the third driver stage DVR3 and the fourth driver stage DVR4, for example), the signal path for the electrical signal Φ contains a delay element Dly whose delay time t2 can be adjusted from a minimum value, which is zero where possible, using an output signal from the measurement and control circuit PD/Ctrl.

If this measurement reveals that the ascertained signal propagation time $t_p$ is at least equal to half the period duration ΦP of the signal Φ which is to be transmitted, the electrical signal Φ to be transmitted is delayed between the two selected driver stages DVR1, DVRn such that a given signal edge change Φ− appears at the output OUTn of the other selected driver stage DVRn at a different time from other signal edge changes $\Phi-_{+1}, \ldots, \Phi-_{+q}$ appearing at the output OUT1 of the one selected driver stage DVR1 and from signal edge changes appearing at the outputs OUT2, ..., OUTn-1 of the other driver stages DVR2 to DVRn-1, if present. Otherwise, the electrical signal Φ is not delayed where possible or the delay is set to a minimum value which is just technically possible on the delay element Dly.

Figure 5:
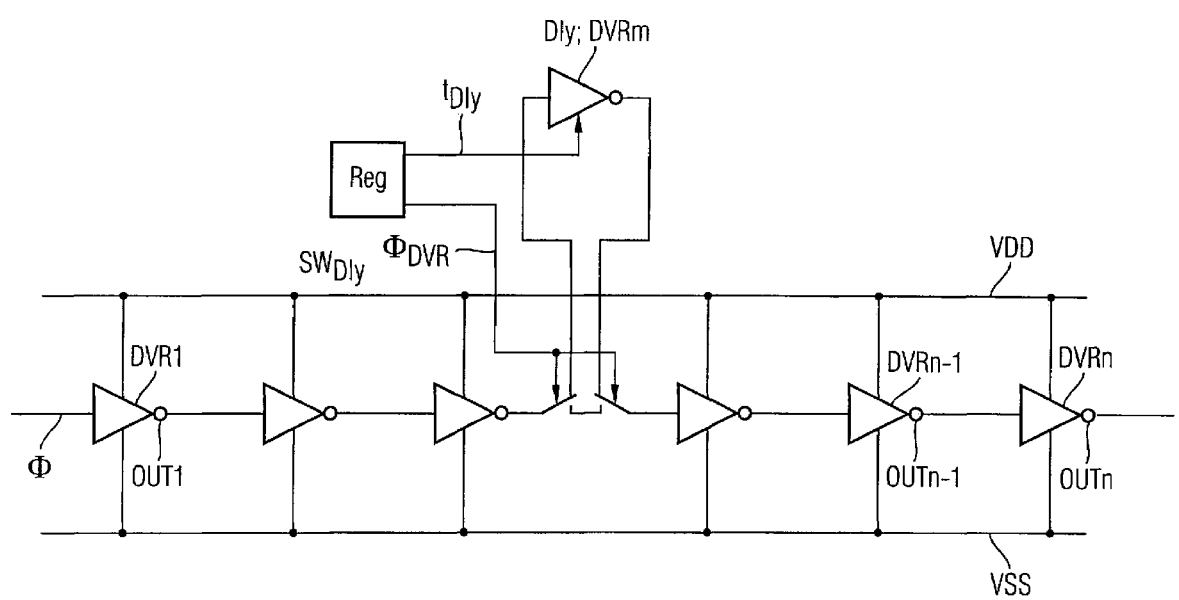

The embodiment shown in FIG. 5 differs from the embodiment shown in FIG. 4 merely in that in the latter case the delay element Dly, which may possibly also be implemented in the form of one or more further driver stages DRVm, is not connected directly in the signal line between the one (DVR1) and the other (DVRn) selected driver stage, but rather that it can be electrically activated in this signal path by switching. In the embodiment shown in FIG. 5, it is also assumed that the aforementioned ascertainment of the signal propagation time $t_p$ has already been performed elsewhere and that on the basis of this measurement result a storage medium Reg (such as one or more registers) firstly stores whether or not the delay element Dly needs to be electrically activated in the signal path (this can then be done using an appropriate value for a switching signal $SW_{Dly}$, said value being stored in the storage medium Reg) and secondly, if a delay is required, also stores what length of time needs to be used to delay the electrical signal Φ which is to be transmitted. This value can then be supplied to the delay element Dly using a delay signal $t_{Dly}$.

The storage medium Reg can also be implemented in a different form, for example in the form of a laser fuse, whose state (electrically conductive or blown) influences the action of the delay element Dly as appropriate.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of Reference Symbols | |
|---|---|
| DVR | Output driver circuit |
| DVR1, DVR2, ..., DVRn | Driver stages |
| DVR1, DVRn | First, last driver stage, also: selected driver stage |

-continued

| List of Reference Symbols | |
|---|---|
| DVRm | Further driver stage |
| IN1, ..., INn | Inputs of the driver stages |
| OUT1, ..., OUTn | Outputs of the driver stages |
| Φ | Electrical signal |
| Φ−, Φ+ | (Particular, given) signal edge change |
| $\Phi-_{+1}, \Phi-_{+q}$ | Other signal edge changes (following the given signal edge change in time) |
| ΦP | Period duration |
| $t_p$ | Signal propagation time |
| Dly | Delay element |
| $t_{Dly}$ | Delay signal |
| $SW_{Dly}$ | Switching signal |
| Reg | Control register |

What is claimed:

1. A method for transmitting an electrical signal that includes a plurality of signal edge changes and a given period duration, the method comprising:
    providing an output driver circuit, the output driver circuit including a plurality of driver stages, wherein the driver stages include a first driver stage and a last driver stage, the driver stages are arranged in series with one another in terms of signal flow, and the electrical signal to be transmitted is supplied to an input of the first driver stage and is transmitted from an output of the last driver stage;
    selecting two driver stages of the output driver circuit and ascertaining the signal propagation time which the signal to be transmitted requires between the input of the one selected driver stage and the output of the other selected driver stage; and
    when the ascertained signal propagation time is at least equal to half the period duration of the signal which is to be transmitted, the electrical signal to be transmitted is delayed between the two selected driver stages such that a given signal edge change appears at the output of the other selected driver stage at a different time from other signal edge changes which follow the one given signal edge change in time and that appear at the output of the one selected driver stage and at the output of any other driver stage in the output driver circuit that is arranged between the two selected driver stages.

2. The method of claim 1, wherein the first driver stage and the last driver stage are selected such that the signal propagation time between the input of the first driver stage and the output of the last driver stage is ascertained.

3. The method of claim 1, wherein the electrical signal to be transmitted is delayed by electrically activating a delay element comprising at least one further driver stage disposed in the signal path between the selected driver stages.

4. The method according to claim 3, wherein the delay element is activated under the control of at least one value stored in a control register of a switching signal.

5. The method of claim 3, wherein a delay time for delaying the electrical signal to be transmitted is stored as a delay signal in a control register.

6. An output driver circuit for an electrical signal which is to be transmitted, the output driver circuit comprising:
    a plurality of driver stages that are arranged in series with one another in terms of signal flow, wherein the driver stages include a first driver stage and a last driver stage; and
    a delay element configured to influence a signal propagation time between an input of a first selected driver stage and an output of another selected driver stage, wherein the delay element is electrically activated in a signal path between the first selected driver stage and the other selected driver stage using at least one switching signal, wherein the value of the switching signal is stored as a manifestation of the state of a laser fuse.

7. The output driver circuit of claim 6, wherein the delay element comprises at least one further driver stage.

8. The output driver circuit of claim 6, wherein the value of the switching signal is stored in a control register.

9. An output driver circuit for an electrical signal which is to be transmitted, the output driver circuit comprising:
  a plurality of driver stages that are arranged in series with one another in terms of signal flow;
  a measurement and control circuit configured to ascertain a signal propagation time; and
  a delay element that has an adjustable delay time;
  wherein:
    the driver stages include a first selected driver stage and another selected driver stage;
    the signal propagation time to be ascertained is that which the electrical signal to be transmitted requires between an input of the first selected driver stage and an output of the other selected driver stage; and
    the delay element is actuated by the measurement and control circuit such that, when the ascertained signal propagation time is at least equal to half the period duration of the signal which is to be transmitted, the delay element delays the electrical signal to be transmitted between the two selected driver stages such that a given signal edge change appears at the output of the other selected driver stage at a different time from other signal edge changes which follow the one given signal edge change in time and that appear at the output of the first selected driver and at the output of any other driver stage in the output driver circuit that is arranged between the two selected driver stages.

* * * * *